(12) United States Patent
Nandakumar et al.

(10) Patent No.: US 7,638,402 B2
(45) Date of Patent: Dec. 29, 2009

(54) SIDEWALL SPACER PULLBACK SCHEME

(75) Inventors: Mahalingam Nandakumar, Richardson, TX (US); Amitava Chatterjee, Richardson, TX (US); Terrence J. Riley, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 366 days.

(21) Appl. No.: 11/728,928

(22) Filed: Mar. 27, 2007

(65) Prior Publication Data

US 2008/0160708 A1 Jul. 3, 2008

Related U.S. Application Data

(60) Provisional application No. 60/877,479, filed on Dec. 28, 2006.

(51) Int. Cl.
*H01L 21/336* (2006.01)
(52) U.S. Cl. ............... 438/305; 438/595; 257/E21.626
(58) Field of Classification Search ............... 438/305, 438/529; 257/E21.626
See application file for complete search history.

(56) References Cited

U.S. PATENT DOCUMENTS

| 6,153,485 | A | * | 11/2000 | Pey et al. ................. 438/305 |
| 6,610,571 | B1 | * | 8/2003 | Chen et al. ................. 438/265 |
| 6,812,091 | B1 | | 11/2004 | Gruening et al. |
| 6,991,979 | B2 | * | 1/2006 | Ajmera et al. ............... 438/230 |
| 7,074,692 | B2 | | 7/2006 | Chen et al. |
| 2002/0076907 | A1 | | 6/2002 | Rodder |
| 2005/0215017 | A1 | | 9/2005 | Chen et al. |

* cited by examiner

*Primary Examiner*—Chandra Chaudhari
(74) *Attorney, Agent, or Firm*—Wade J. Brady, III; Frederick J. Telecky, Jr.

(57) ABSTRACT

A sidewall spacer pullback scheme is implemented in forming a transistor. The scheme, among other things, allows silicide regions of the transistor to be made larger, or rather have a larger surface area. The larger surface area has a lower resistance and thus allows voltages to be applied to the transistor more accurately. The scheme also allows transistors to be made slightly thinner so that the formation of voids in a layer of dielectric material formed over the transistors is mitigated. This mitigates yield loss by facilitating more predictable or otherwise desirable transistor behavior.

18 Claims, 9 Drawing Sheets

SIDEWALL SPACER PULLBACK SCHEME

RELATED APPLICATION

This application claims priority to U.S. Provisional Application Ser. No. 60/877,479 filed Dec. 28, 2006, entitled "SIDEWALL SPACER PULLBACK SCHEME."

FIELD

The disclosure herein relates generally to semiconductor processing, and more particularly to implementing a sidewall spacer pullback scheme.

BACKGROUND

Several trends presently exist in the semiconductor and electronics industry. Devices are continually being made smaller, faster and requiring less power. One reason for these trends is that more personal devices are being fabricated that are relatively small and portable, thereby relying on a battery as their primary supply. For example, cellular phones, personal computing devices, and personal sound systems are devices that are in great demand in the consumer market. In addition to being smaller and more portable, personal devices are also requiring increased memory and more computational power and speed. In light of these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there has been and continues to be efforts toward scaling down dimensions (e.g., at submicron levels) on semiconductor wafers, that are generally produced from bulk silicon. In order to accomplish such high densities, smaller feature sizes, smaller separations between features, and more precise feature shapes are required in integrated circuits (ICs) fabricated on small rectangular portions of the wafer, commonly known as die. This may include the width and spacing of interconnecting lines, spacing and diameter of contact holes, as well as the surface geometry of various other features (e.g., corners and edges).

It can be appreciated that significant resources go into scaling down device dimensions and increasing packing densities. For example, significant man hours may be required to design such scaled down devices, equipment necessary to produce such devices may be expensive and/or processes related to producing such devices may have to be very tightly controlled and/or be operated under very specific conditions, etc. Accordingly, it can be appreciated that there can be significant costs associated with exercising quality control over semiconductor fabrication, including, among other things, costs associated with discarding defective units, and thus wasting raw materials and/or man hours, as well as other resources, for example. Additionally, since the units are more tightly packed on the wafer, more units are lost when some or all of a wafer is defective and thus has to be discarded. Accordingly, techniques that mitigate yield loss (e.g., a reduction in the number of acceptable or usable units), among other things, would be desirable.

SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

A sidewall spacer pullback scheme is implemented in forming a transistor. The scheme, among other things, allows silicide regions of the transistor to be made larger, or rather have a larger surface area. The larger surface area has a lower resistance and thus allows voltages to be applied to the transistor more accurately. The scheme also allows transistors to be made slightly thinner so that the formation of voids in a layer of dielectric material formed over the transistors is mitigated. This mitigates yield loss by facilitating more predictable or otherwise desirable transistor behavior.

To the accomplishment of the foregoing and related ends, the following description and annexed drawings set forth certain illustrative aspects. Other aspects, advantages and/or features may, however, become apparent from the following detailed description when considered in conjunction with the annexed drawings.

DETAILED DESCRIPTION

Figure 1:
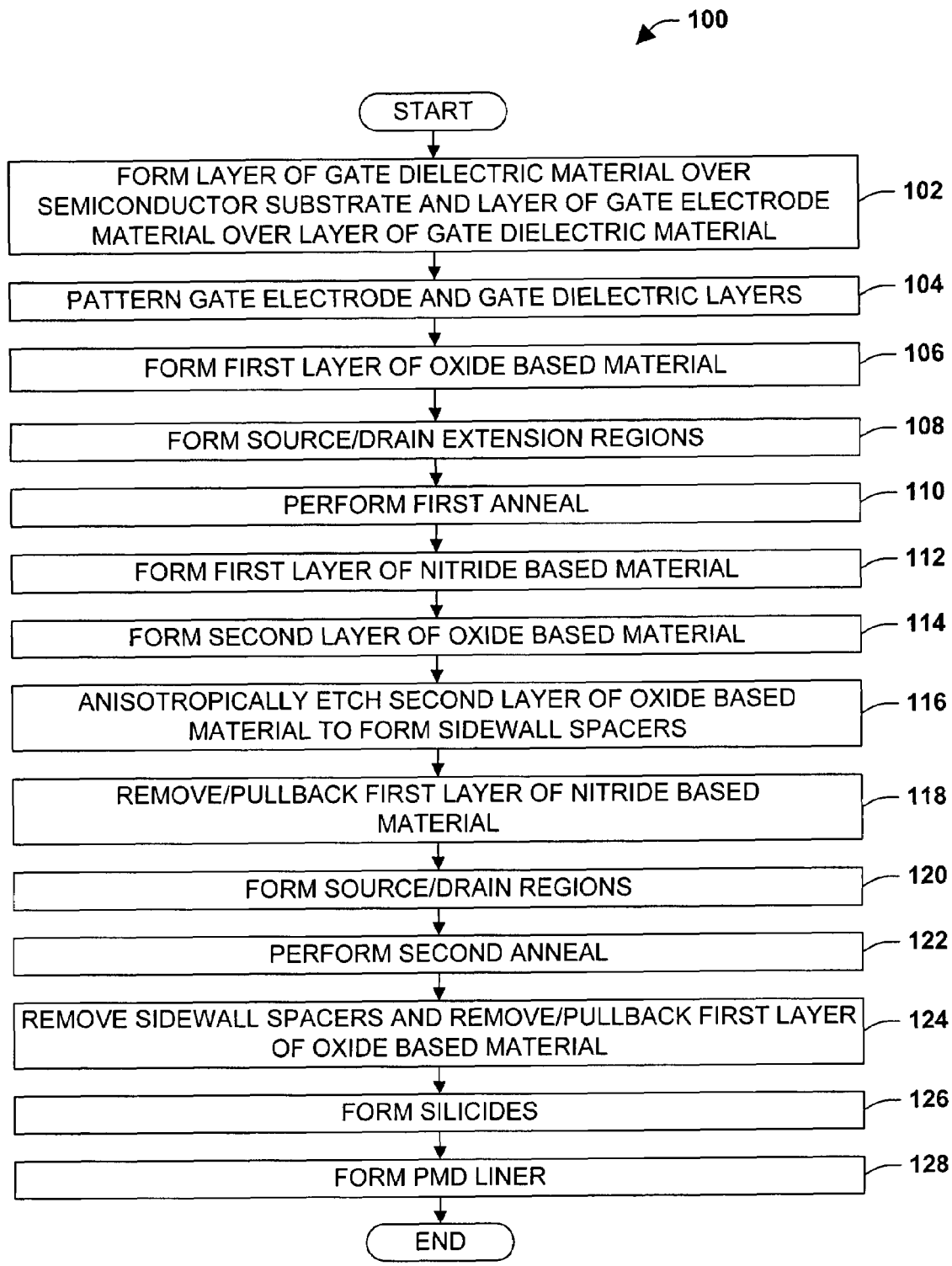
FIG. 1 is a flow diagram illustrating an example methodology for implementing a sidewall spacer pullback scheme.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

An example methodology 100 for implementing a sidewall spacer pullback scheme is illustrated in FIG. 1, and an example semiconductor substrate 200 whereon such a methodology is implemented in forming a transistor is illustrated in cross-sectional view in FIGS. 2-15. While the method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2:
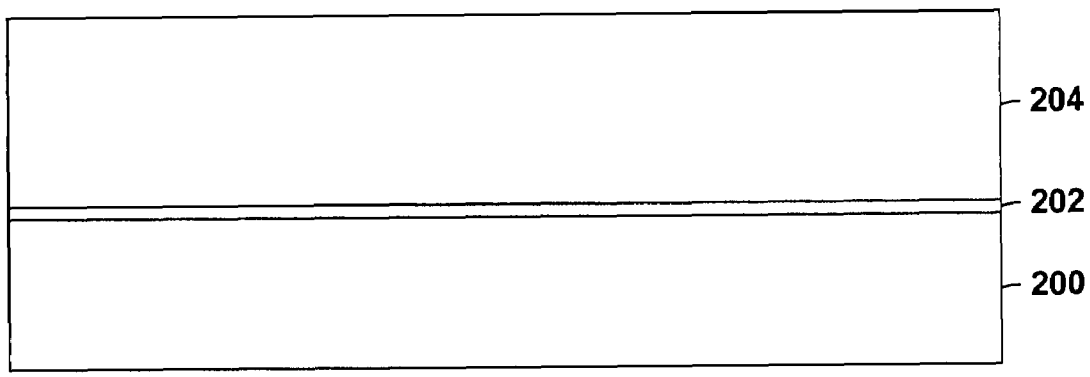
FIGS. 2-15 are cross-sectional views of an example semiconductor substrate whereon a sidewall spacer pullback scheme is implemented in forming a transistor.

At 102, a layer of gate dielectric material 202 is formed over the semiconductor substrate 200 and a layer of gate electrode material 204 is formed over the layer of gate dielectric material 202 (FIG. 2). The layer of gate dielectric material 202 generally comprises an oxide (or other dielectric) based material and/or a high-k material, for example, and is relatively thin, being formed to a thickness of between about 1 nm and about 20 nm, for example. The layer of gate electrode material 204 generally comprises a polysilicon (or other semiconductor) based material, and is formed to a thickness of between about 20 nm and about 100 nm, for example.

Figure 3:
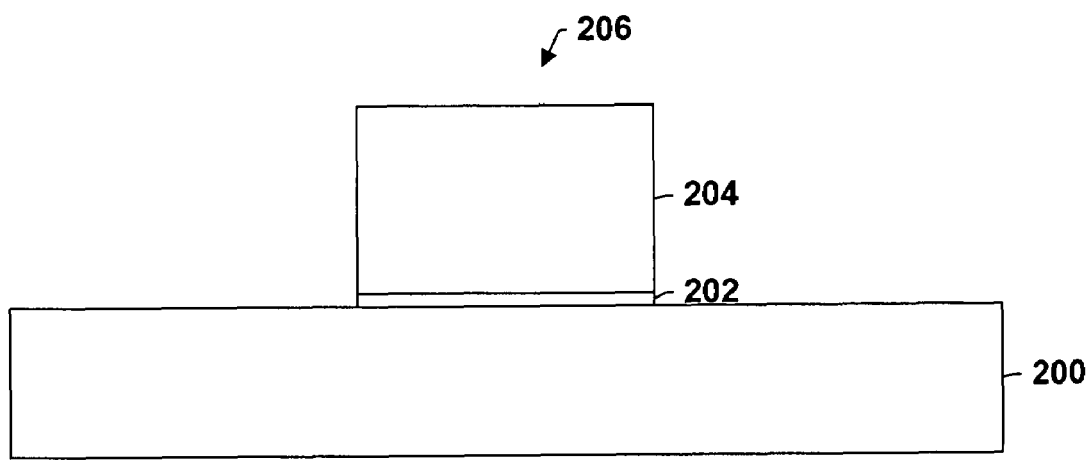

The layer of gate electrode material 204 and the layer of gate dielectric material 202 are then patterned at 104 to establish a gate structure or stack 206 (FIG. 3). It will be appreciated that this, as well as other patterning described herein, can be performed with lithographic techniques, where lithography refers to processes for transferring one or more patterns between various media. In lithography, a light sensitive resist coating is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched).

Figure 4:
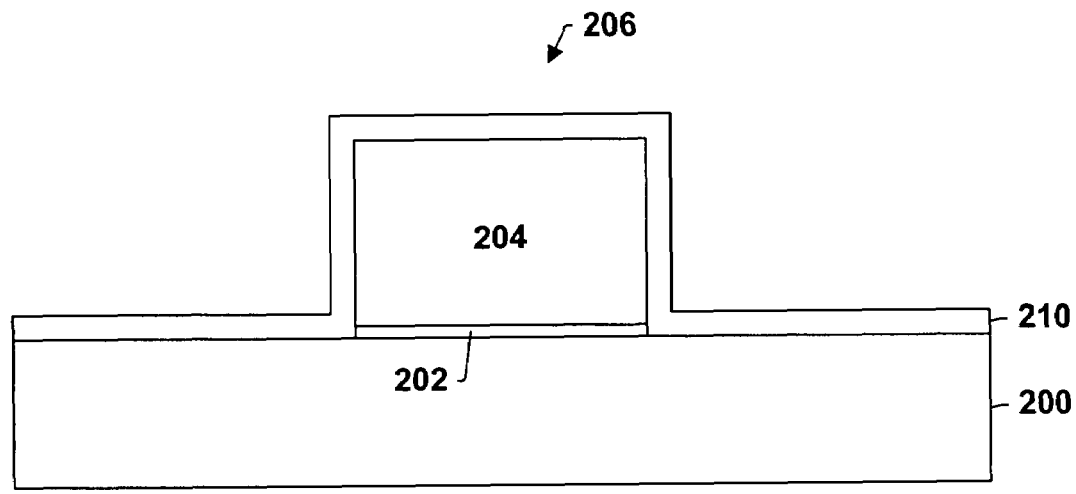

A relatively thin first layer of oxide (or other dielectric) based material 210 is then formed over the gate stack 206 and exposed portions of the substrate 200 at 106 (FIG. 4). By way of example, the first layer of oxide based material 210 may be formed by a well controlled deposition process to a thickness of between about 1 nm and about 25 nm, for example. Alternatively, a thermal growth process may be employed to form the first layer of oxide based material 210. In this case, since the layer of gate electrode material 204 may comprise polysilicon, and the first layer of oxide based material 210 is grown therefrom (as well as from the substrate 200), the first layer of oxide based material 210 may be referred to as a layer of poly-ox based material, for example.

Figure 5:
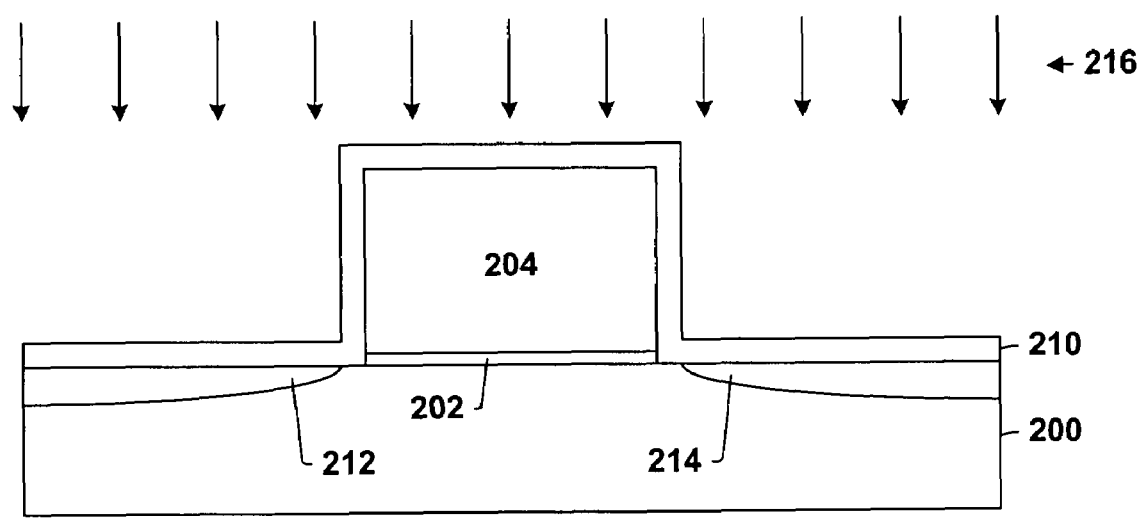
Figure 6:
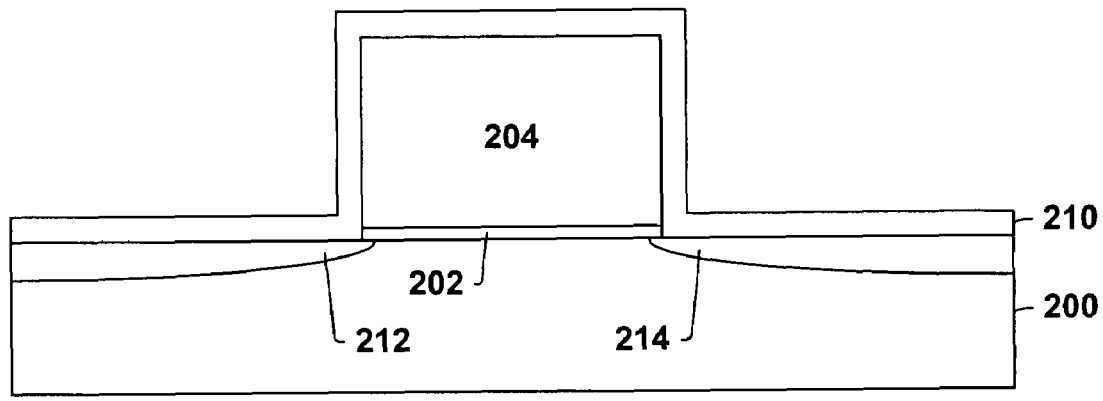

At 108, source 212 and drain 214 extension regions are formed in the substrate 200 by a first implantation 216 whereby dopants are implanted into the substrate 200, where the dopants are substantially blocked by the gate stack 206 (FIG. 5). Depending upon the type of transistor being formed (e.g., PMOS or NMOS), p type dopant atoms (e.g., Boron (B)) and/or n type dopant atoms (e.g., Phosphorous (P), Arsenic (As) and/or Antimony (Sb)) can be implanted at 108. It can be appreciated that some of the dopants may also be implanted into the top of the gate electrode 204 during the implantation at 108 (e.g., depending upon the thickness of the first 210 layer of oxide based material 210 overlying the gate electrode 204—which can be selectively etched a desired degree in a prior action). Similarly, the dopant atoms establishing the source 212 and drain 214 extension regions may or may not be implanted through the first 210 layer of oxide based material (or remaining degrees thereof). For example, a desired amount of areas of the first layer of oxide based 210 material overlying areas of the substrate 200 where the source 212 and drain 214 extension regions are to be formed may be removed (e.g., etched to be thinner—or completely stripped) before the implantation 216 is performed at 108. Although not illustrated, it will be apparent to those skilled in the art that (1) relatively thin offset spacers may be formed along the sides of the gate stack 206 before the source 212 and drain 214 extension regions are formed at 108 and (2) "halo" or "pocket" implants—P type for NMOS and N type for PMOS transistors—can be implanted along with the source-drain extension implants. At 110, an optional first anneal is performed whereby the dopant atoms/molecules of the source 212 and drain 214 extension regions are "activated" and driven under the gate stack 206 slightly (FIG. 6).

Figure 7:
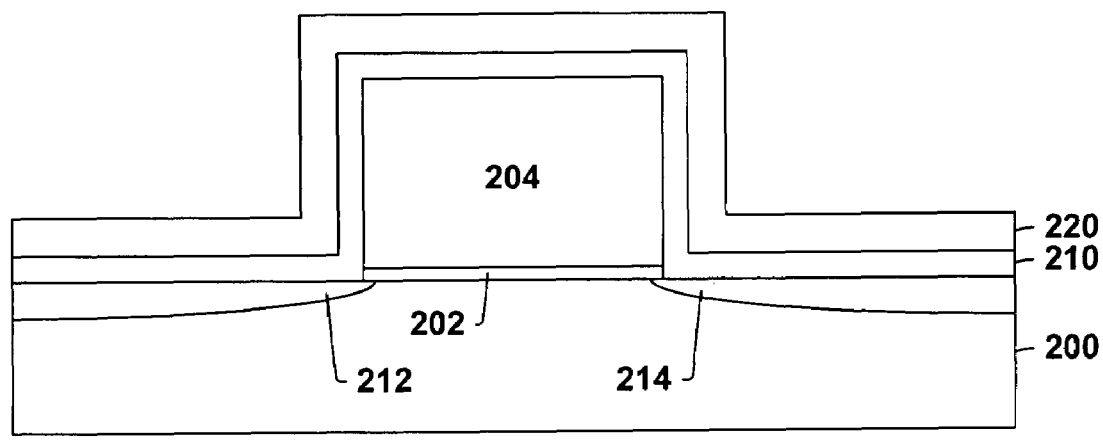
Figure 8:
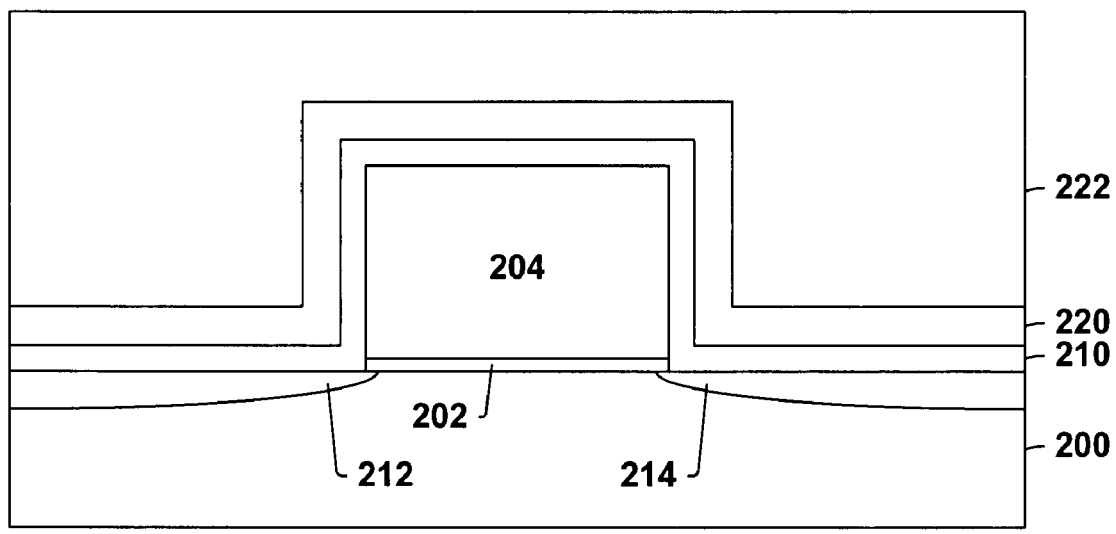

At 112, a first layer of nitride based material 220 is formed (e.g., deposited) over the first layer of oxide based material 210 (FIG. 7). The first layer of nitride based material 220 may be formed to a thickness of between about 5 nm and about 30 nm, for example. A second layer of oxide (or other dielectric) based material 222 is formed (e.g., deposited) over the first layer of nitride based material 220 at 114 (FIG. 8). The second layer of oxide based material 222 may be formed to a thickness of between about 10 nm and about 80 nm, for example. Although not illustrated, it will be appreciated that a thin capping oxide layer may optionally be formed over the first layer of oxide based material 210 before the nitride layer 220 is formed. The first layer of nitride based material 220 would then be formed over this capping oxide layer. Such a capping oxide layer would be processed like the oxide layer 210 (e.g., as discussed below).

Figure 9:
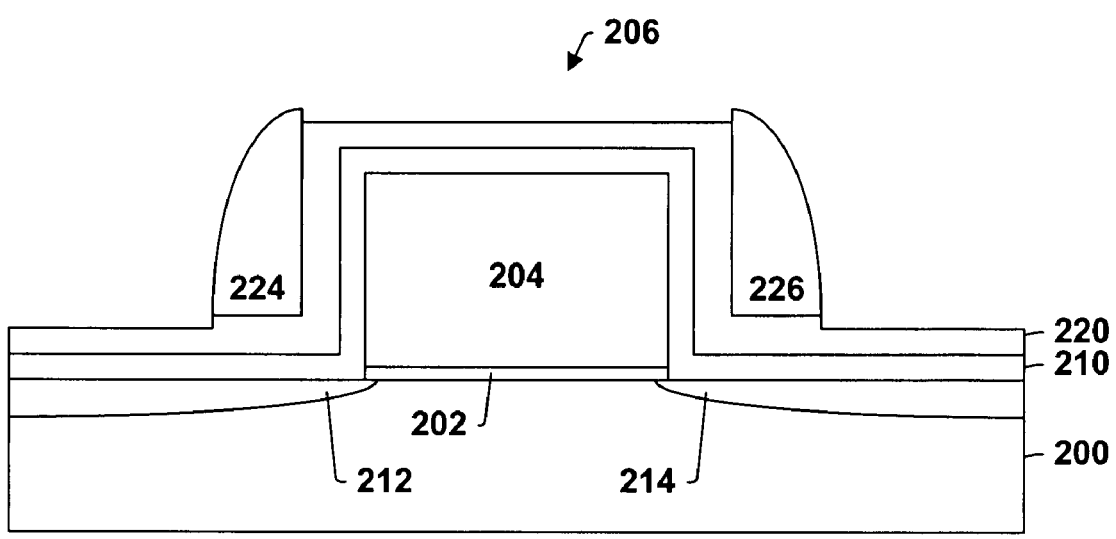

At 116, the second layer of oxide based material 222 is anisotropically etched (or otherwise patterned) so that a first sidewall spacer 224 is formed on one side of the gate stack 206 and a second sidewall spacer 226 is formed on the other side of the gate stack 206 (FIG. 9). It will be appreciated that at least some of the first layer of nitride based material 220 is also removed during the patterning at 116. This can be accomplished, for example, by performing a dry etch that has a chemistry that removes the oxide based material of layer 222 substantially faster than the nitride based material of layer 220. Such a chemistry may comprise oxygen and/or hydrogen, for example.

Figure 10:
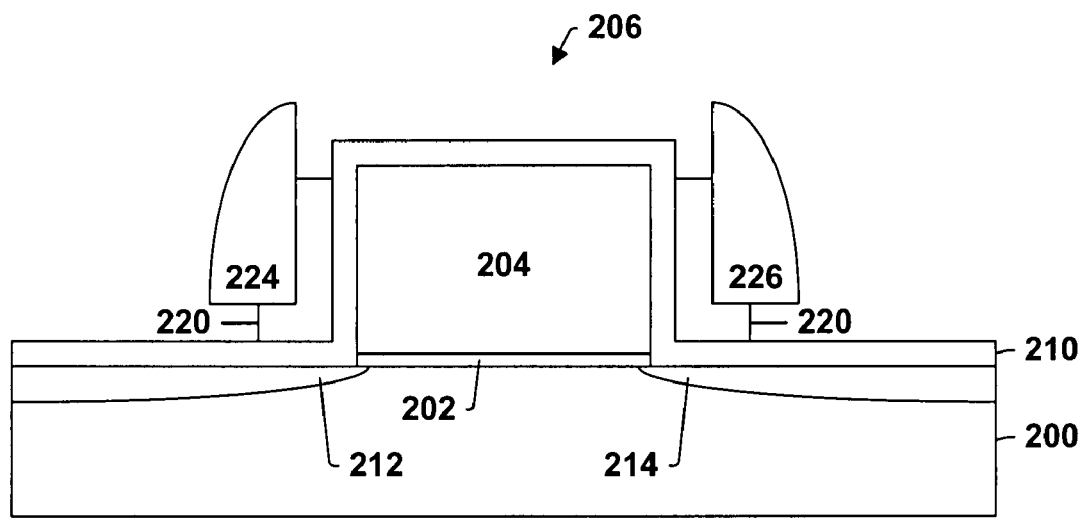

The first layer of nitride based material 220 is then pulled back below and/or under the sidewall spacers 224, 226 slightly at 118 (FIG. 10). As will be appreciated, pulling layer 220 under spacers 224, 226 facilitates forming larger (and less resistive) suicide areas. This can be accomplished, for example, by performing a wet etch with (hot) phosphoric acid that removes the nitride based material of layer 220 at a significantly higher rate than the oxide based materials of layer 210 and the sidewall spacers 224, 226.

Figure 11:
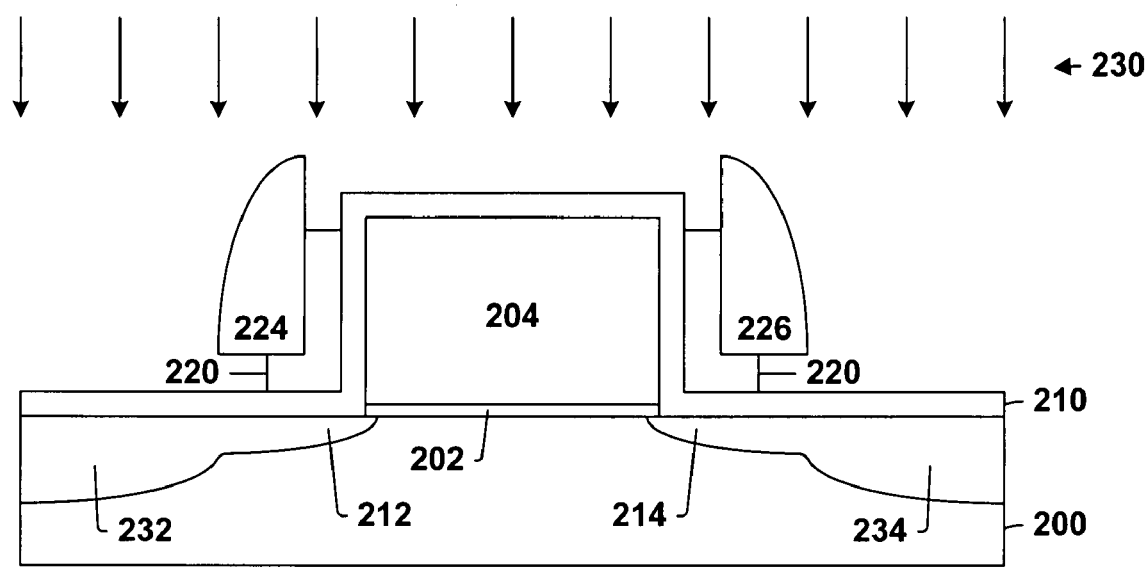

A second implantation 230 is performed at 120 for form source 232 and drain 234 regions in the substrate 200, where dopant atoms are again substantially blocked by the gate stack 206, as well as by the first 224 and second 226 sidewall spacers so that the source region 232 is adjacent to or self aligned with the first sidewall spacer 224 and the drain region 234 is adjacent to or self aligned with the second sidewall spacer 226 (FIG. 11). As with the extension regions 212, 214, p (e.g., Boron (B)) or n (e.g., Phosphorous (P), Arsenic (As) and/or Antimony (Sb)) type dopant atoms can be implanted at 120, depending on the type of transistor being formed (e.g., PMOS or NMOS). Some of the dopants may also be implanted into the top of the gate electrode 204 during the implantation at 120 (e.g., depending upon the thickness of the first layer of oxide based material 210 overlying the gate electrode 204—which can be selectively etched a desired degree in a prior action). Similarly, the dopant atoms establishing the source 232 and drain 234 regions may or may not be implanted through the first 210 layer of oxide based material (or remaining degrees thereof). For example, a desired amount of areas of the first layer of oxide based 210 material overlying areas of the substrate 200 where the source 232 and drain 234 regions are to be formed may be removed (e.g., etched to be thinner—or completely stripped) before the implantation 230 is performed at 120. It will be appreciated that the second implant 230 is generally performed at a higher energy than the first implant 108. Accordingly, the source 232 and drain 234 regions are formed somewhat deeper in the substrate 200 than the source 212 and drain 214 extension regions. Although not illustrated, it will be appreciated that additional implantations may be performed, such as to establish pockets implants in the substrate, for example.

Figure 12:
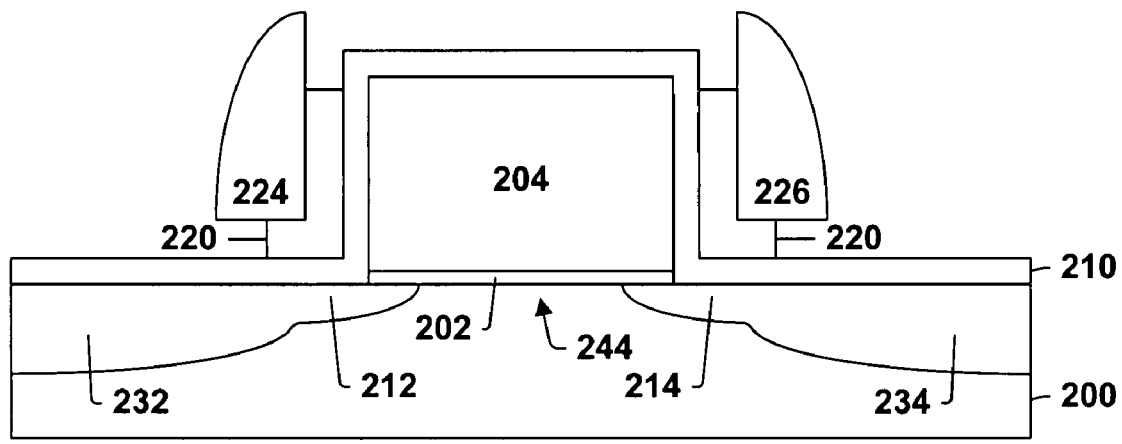

An optional second anneal is performed at 122 to "activate" the dopant atoms/molecules of the source 232 and drain 234 regions and drive them slightly under the gate stack 206 (FIG. 12). It will be appreciated that the second anneal 122 is generally performed at a higher temperature than the first anneal 110. Accordingly, even though the source 212 and drain 214 extension regions may have already been "activated" by the first anneal at 110, the source 212 and drain 214 extension regions are further "activated" and driven under the gate stack 206 by the second anneal at 122. It will be appreciated that a channel region 244 is defined in the substrate 200 under the gate stack 206 and between the source 212 and drain 214 extension regions (FIG. 12). The transistor "operates", at least in part, by conducting a current in the channel region 244 between the source 212 and drain 214 extension regions when certain (respective) voltages are applied to the gate electrode 204, the source region 232 and the drain region 234.

Figure 13:
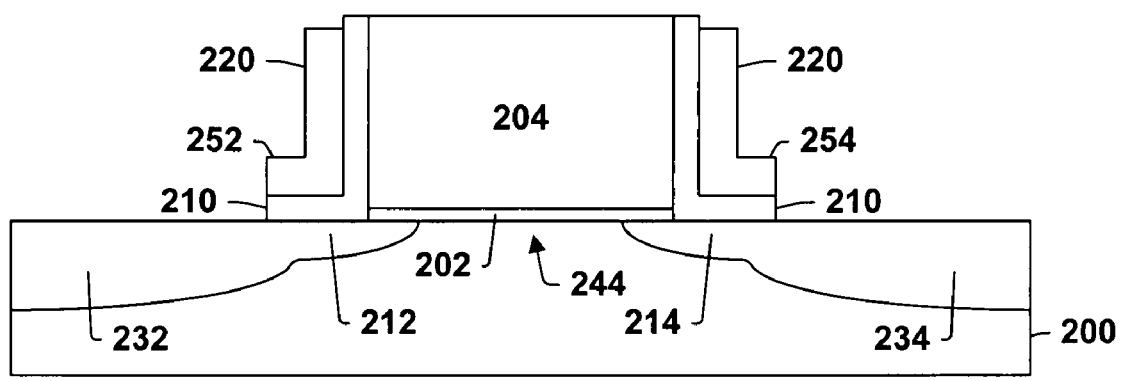
Figure 14:
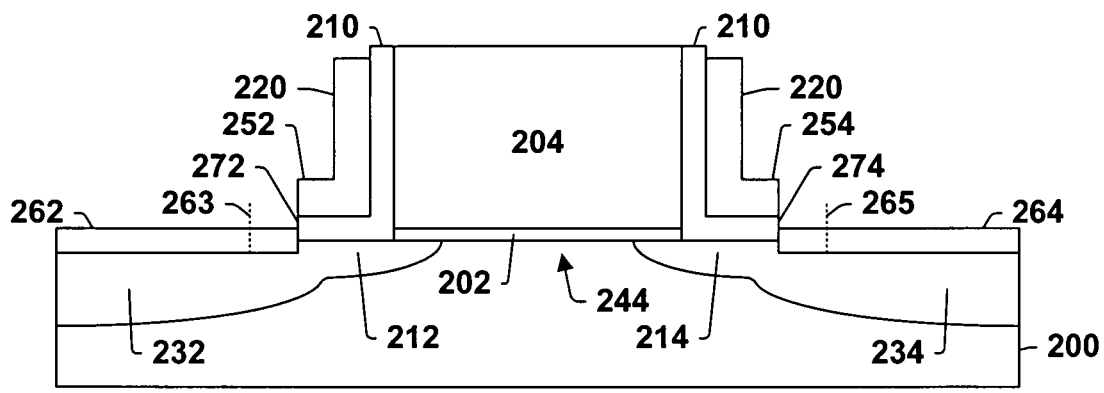

At 124, the sidewall spacers 224 and 226 are removed (e.g., stripped) to reveal the remaining nitride material 220 that was formerly protected by the oxide spacers 224, 226 (FIG. 13). The first layer of oxide based material 210 is also pulled/etched back to be substantially flush (or even undercut) with respective lateral extents 252, 254 of the nitride material 220 (FIG. 13). It will be appreciated that this can be performed in a single act since the sidewall spacers 224, 226 and layer 210 both comprise oxide and thus may be removed concurrently with the same etchant. Additionally, similar to other acts discussed herein, it will be appreciated that the anneal performed at 122 and the removal performed at 124 need not be carried out in illustrated order. For example, the second anneal performed at 122 may be performed after the removal process performed at 124.

Silicide regions 262, 264 are formed in the substrate 200 above the source 232 and drain 234 regions at 126 (FIG. 14) (e.g., by exposing and treating areas of the substrate above the source 232 and drain 234 regions). The silicide regions 262, 264 are electrically conductive and may comprise a metal, for example. The silicide regions 262, 264 allow an external bias voltage to be applied to the source 232 and drain 234 regions of the transistor. Although not illustrated, a silicide region may also be formed in the gate electrode 204 to similarly allow an external bias to be applied thereto.

It will be appreciated that pulling back the first layer of nitride based material 220 at 118 (FIG. 10) allows the silicide regions 262, 264 to be made larger than they otherwise would be. For example, in the absence of this pullback, the silicide regions 262, 264 would only extend in toward the gate stack 206 to lines 263, 265 (e.g., as defined by the width of the sidewall spacers 224, 226). Accordingly, since the silicide regions 262, 264 abut the lateral extents 272, 274 of nitride layer 220, these silicide regions 262, 264 are larger because the extents 272, 274 are moved in toward the gate stack 206. These larger silicide regions 262, 264 yield larger contact areas for applying voltages to the source 232 and drain 234 regions. Since resistance is a function of contact area, these larger silicide regions 262, 264 result in lower resistances, and thus allow the source 232 and drain 234 regions to be biased more accurately, which in turn mitigates yield loss by facilitating more predictable or otherwise desirable transistor behavior.

Figure 15:
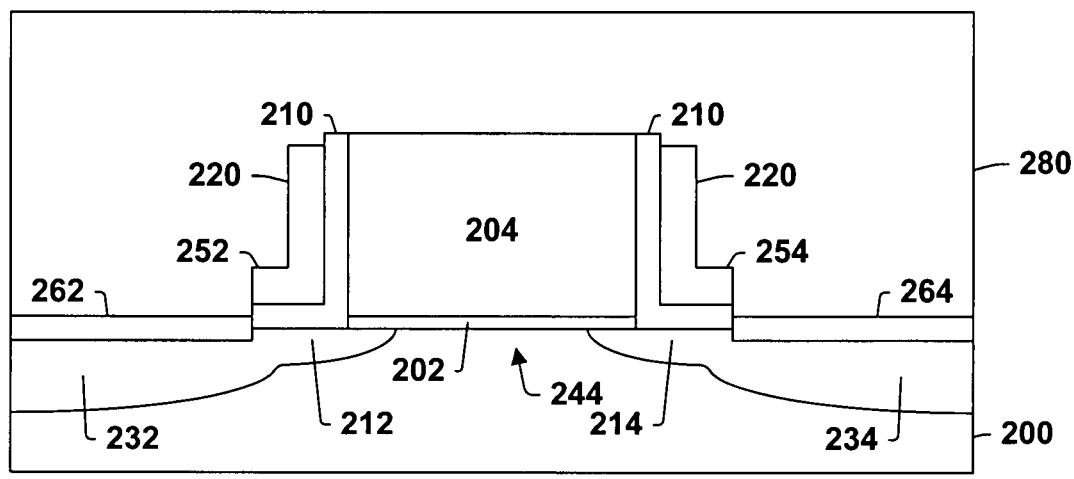

At 128, a contact etch stop layer (CESL) or pre metal dielectric (PMD) liner 280 is formed over the transistor device (FIG. 15). This layer 280 may comprise a nitride based material, for example, and may be formed to a thickness of between about 10 nm and about 150 nm, for example. It will be appreciated that the pullback scheme described herein decreases the width of resulting transistors, improving their aspect ratio (which is essentially a ratio of space between adjacent transistors to transistor height). This mitigates the formation of holes or voids in the in the PMD liner 280, where such voids can cause shorting between adjacent devices (e.g., transistors) as well as other undesirable behavior(s).

Figure 16:
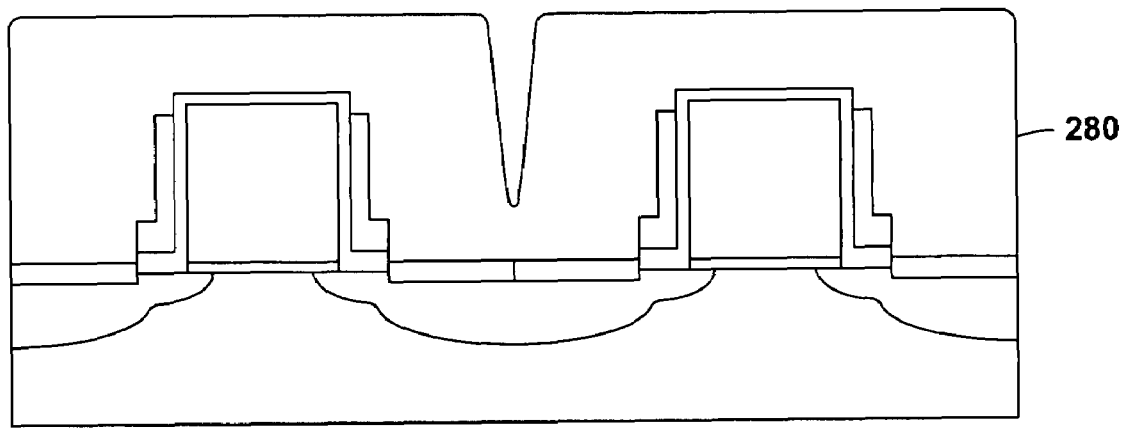
FIG. 16 is a cross sectional view illustrating the lack of voids in a dielectric layer formed over of a couple of transistors formed with a sidewall spacer pullback scheme.
Figure 17:
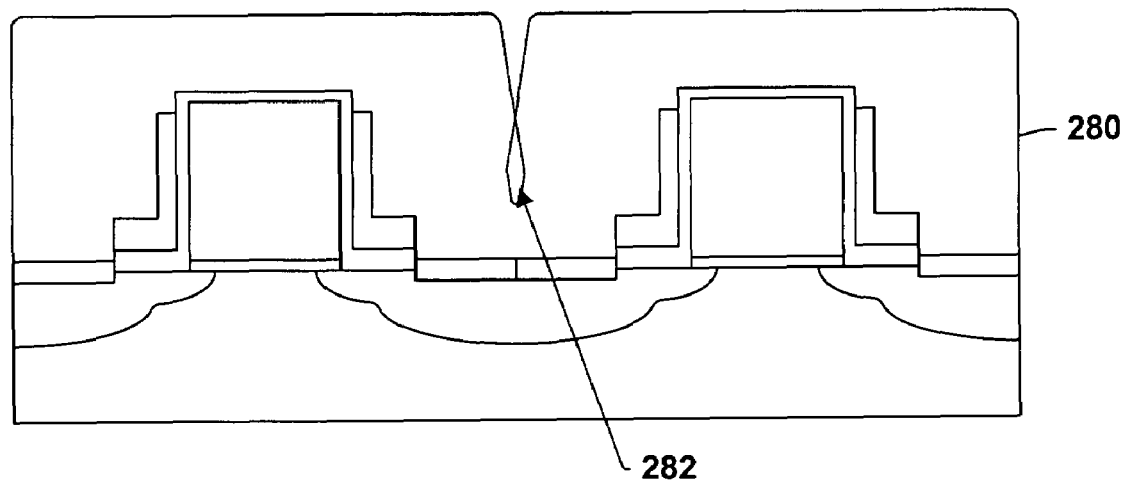
FIG. 17 is a cross sectional view illustrating the presence of a void in a dielectric layer formed over of a couple of transistors that are not formed with a sidewall spacer pullback scheme.

FIG. 16 illustrates a couple of adjacent transistors formed according to the pullback scheme described herein, while FIG. 17 similarly illustrates a couple of transistors but not formed according to the pullback scheme described herein. The slightly smaller width of the transistors illustrated in FIG. 16 allows the (conformal) PMD liner 280 to be formed thereover without having voids formed therein. When the PMD liner 280 is formed over the wider transistors illustrated in FIG. 17, however, a void 282 forms therein because the PMD liner 280 somewhat "nests" upon itself between the adjacent transistors. Moreover, such voids can occur more often and to a greater degree in "field" areas of the substrate adjacent to "active" areas where the transistors are formed. Additionally, subsequently formed layers may not fill in completely resulting in voids. The formation of such voids is undesirable. It can thus be appreciated that implementing the pullback scheme described herein further mitigates yield loss by mitigating the formation of undesirable voids between adjacent semiconductor devices.

It will be appreciated that, substrate and/or semiconductor substrate as used herein may comprise any type of semiconductor body (e.g., silicon, SiGe, SOI) such as a semiconductor wafer and/or one or more die on a wafer, as well as any other type of semiconductor and/or epitaxial layers associated therewith. Also, while reference is made throughout this document to exemplary structures in discussing aspects of methodologies described herein (e.g., those structures presented in FIGS. 2-15 while discussing the methodology set forth in FIG. 1), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method for implementing a sidewall spacer pullback scheme in forming a transistor, comprising:
   forming a first layer of oxide based material over exposed portions of a semiconductor substrate and over a gate stack formed over the semiconductor substrate;
   performing a first implantation of dopants to form a source extension and halo/pocket region in the semiconductor substrate adjacent to a first side of the gate stack and a drain extension and halo/pocket region in the semiconductor substrate adjacent to a second side of the gate stack;
   performing a first anneal;
   forming a first layer of nitride based material over the first layer of oxide based material;
   forming a second layer of oxide based material over the first layer of nitride based material;
   patterning the second layer of oxide based material to form a first sidewall spacer on the first side of the gate stack and a second sidewall spacer on the second side of the gate stack;
   removing at least some of the first layer of nitride based material when patterning the second layer of oxide based material;
   pulling back the first layer of nitride based material under the sidewall spacers;
   performing a second implantation of dopants to form a source region in the semiconductor substrate adjacent to the first sidewall spacer and a drain region in the semiconductor substrate adjacent to the second sidewall spacer;
   performing a second anneal;
   removing the sidewall spacers;
   pulling back the first layer of oxide based material such that a lateral extent of the pulled back first layer of oxide based material is substantially flush or undercut with a lateral extent of the pulled back first layer of nitride based material;
   forming silicide regions in the substrate above the source and drain regions that abut the lateral extents of the pulled back first layer of nitride based material; and
   forming a pre metal dielectric (PMD) liner over the silicide regions and gate stack.

2. The method of claim 1, the first layer of oxide based material pulled back concurrently with the removal of the sidewall spacers.

3. The method of claim 1, comprising:
   performing a dry etch to form the sidewall spacers and remove at least some of the first layer of nitride based material.

4. The method of claim 2, comprising:
   performing a dry etch to form the sidewall spacers and remove at least some of the first layer of nitride based material.

5. The method of claim 3, the dry etch comprising a chemistry of oxygen and hydrogen.

6. The method of claim 4, the dry etch comprising a chemistry of oxygen and hydrogen.

7. The method of claim 1, comprising:
   performing a wet etch to pullback the first layer of nitride based material.

8. The method of claim 2, comprising:
   performing a wet etch to pullback the first layer of nitride based material.

9. The method of claim 3, comprising:
   performing a wet etch to pullback the first layer of nitride based material.

10. The method of claim 5, comprising:
    performing a wet etch to pullback the first layer of nitride based material.

11. The method of claim 7, the wet etch comprising a chemistry of phosphoric acid.

12. The method of claim 10, the wet etch comprising a chemistry of phosphoric acid.

13. The method of claim 1, comprising:
    forming a thin capping oxide layer over the first layer of oxide based material before forming the first layer of nitride based material.

14. The method of claim 12, comprising:
    forming a thin capping oxide layer over the first layer of oxide based material before forming the first layer of nitride based material.

15. A method for implementing a sidewall spacer pullback scheme in forming a transistor, comprising:
    forming a first layer of oxide based material over exposed portions of a semiconductor substrate and over a gate stack formed over the semiconductor substrate;
    forming a first layer of nitride based material over the first layer of oxide based material;
    forming a second layer of oxide based material over the first layer of nitride based material;
    patterning the second layer of oxide based material to form a first sidewall spacer on the first side of the gate stack and a second sidewall spacer on the second side of the gate stack;
    removing at least some of the first layer of nitride based material when patterning the second layer of oxide based material;
    pulling back the first layer of nitride based material under the sidewall spacers;
    forming a source region in the semiconductor substrate adjacent to the first sidewall spacer and a drain region in the semiconductor substrate adjacent to the second sidewall spacer;
    removing the sidewall spacers;
    pulling back the first layer of oxide based material such that a lateral extent of the pulled back first layer of oxide based material is substantially flush or undercut with a lateral extent of the pulled back first layer of nitride based material; and
    forming silicide regions in the substrate above the source and drain regions that abut the lateral extents of the pulled back first layer of nitride based material.

16. The method of claim 15, the first layer of oxide based material pulled back concurrently with the removal of the sidewall spacers.

17. The method of claim 15, comprising:
    performing a dry etch with a chemistry of oxygen and hydrogen to form the sidewall spacers and remove at least some of the first layer of nitride based material.

18. The method of claim 15, comprising:
    performing a wet etch with a chemistry of phosphoric acid to pullback the first layer of nitride based material.

* * * * *